United States Patent [19]
Hirao et al.

[11] Patent Number: 5,560,785
[45] Date of Patent: Oct. 1, 1996

[54] METHOD FOR FORMING A PROTECTIVE CHEMICAL LAYER ON COPPER AND COPPER ALLOY SURFACES

[75] Inventors: Hirohiko Hirao; Yoshimasa Kikukawa; Toshihiro Okamoto; Takayuki Murai; Seiji Sogabe; Miya Tanioka; Rie Nakayama; Takashi Yoshioka, all of Marugame, Japan

[73] Assignee: Shikoku Chemicals Corporation, Marugame, Japan

[21] Appl. No.: 520,477

[22] Filed: Aug. 29, 1995

Related U.S. Application Data

[62] Division of Ser. No. 239,557, May 9, 1994, Pat. No. 5,498,301.

[30] Foreign Application Priority Data

May 10, 1993 [JP] Japan ................................ 5-132998
Mar. 8, 1994 [JP] Japan ................................ 6-65502

[51] Int. Cl.$^6$ ................................................ C23C 22/06
[52] U.S. Cl. ................................................ 148/269
[58] Field of Search ........................ 148/269; 106/14.16, 106/14.17

[56] References Cited

FOREIGN PATENT DOCUMENTS 1287854  9/1972  United Kingdom .

OTHER PUBLICATIONS

Chemical Abstracts, vol. 107, No. 16, 19 Oct. 19, 1987.
Patent Abstracts of Japan, vol. 16, No. 544 (C–1004) 13 Nov. 1992.
Patent Abstracts of Japan, vol. 16, No. 539 (E–1289) 10 Nov. 1992.
Patent Abstracts of Japan, vol. 5, No. 168 (C–077) 27 Nov. 1981.
Patent Abstracts of Japan, vol. 12, No. 117 (C–487) 13 Apr. 1988.
Patent Abstracts of Japan, vol. 5, No. 128 (C–67) (800) 18 Aug. 1981.

*Primary Examiner*—Sam Silverberg
*Attorney, Agent, or Firm*—Sherman and Shalloway

[57] ABSTRACT

A water-based surface treatment agent is used to provide a chemical layer on a copper or copper alloy printing wiring board (PWB). The chemical layer shows excellent heat-resistance and moisture-resistance. The treated PWB maintains excellent solderability for extended lengths of time. The water-based surface treatment agent contains as an active ingredient 2,4-diphenylimidazole, 2,4-diphenyl-5-methylimidazole or 2-phenyl-4-benzyl-5-methylimidazole. The treating compositions with a lower carboxylic acid of up to 4 carbon atoms are soluble in water, and have improved solder wetting properties and improved solder paste spreading property. A copper compound may be included in the aqueous solution to increase the rate at which the chemical layer is formed.

8 Claims, No Drawings

5,560,785

METHOD FOR FORMING A PROTECTIVE CHEMICAL LAYER ON COPPER AND COPPER ALLOY SURFACES

This is a division of application Ser. No. 08/239,557, filed May 9, 1994, which issued on Mar. 12, 1996 as U.S. Pat. No. 5,498,30.

BACKGROUND OF THE INVENTION

1. Field of the Invention

The present invention relates to water-based surface treating agent that forms a chemical layer on the surfaces of copper and copper alloys and is suited for use as a preflux for copper circuit on rigid printed wiring boards and on flexible printed wiring boards.

2. Prior Art

Surface treatment methods of forming a chemical layer of an alkylimidazole compound having a long-chain alkyl group at the 2-position on the surfaces of copper or copper alloys have been disclosed in Japanese Patent Publications Nos. 17046/19710 11454/1973, 25621/1973, 1983/1974, 26183/1974, 22545/1983, 41988/1986 and in Japanese Laid-Open Patent Publication No. 90492/1986.

Surface treatment methods of forming a chemical layer of an imidazole compound substituted with an aryl group at the 2-position on the surfaces of copper or cop per alloys have been disclosed in Japanese Laid-Open Patent Publications Nos. 202780/1992 and 206681/1992.

As for the surface treatment methods of forming a chemical layer of a benzimidazole-type compound on the surfaces of copper or copper alloys, a surface treatment method using a 5-methylbenzimidazole has been disclosed in Japanese Laid-Open Patent Publication No. 501281/1983, and surface treatment methods using a 2-alkylbenzimidazole compound, a 2-arylbenzimidazole compound, a 2-aralkylbenzimidazole compound and a 2-mercaptoalkylbenzimidazole compound have been disclosed in Japanese Laid-Open Patent Publications Nos. 124395/1991, 236478/1991, 72072/1992, 80375/1982, 99285/1992, 157174/1992, 165083/1992, 173983/1992, 183874/1992, 202780/1992, 206681/1992, 218679/1992, 25407/1993, 93280/1993, 93281/1993, 156475/1993, 163585/1993, 175643/1993, 186880/1993, 186888/1993, 202492/1993, 230674/1993, 237688/1993, 263275/1993, 287562/1993, 291729/1993, 287563/1993 and 291729/1993.

Furthermore, methods of preventing copper or copper alloys from rusting by using a 2-mercaptobenzimidazole have been disclosed in Japanese Laid-Open Patent Publications Nos. 83157/1980, 77600/1987 and 118598/1988.

In recent years, surface mount device (SMD) have in many cases been mounted on the surfaces of the printed wiring boards (PWBs). Therefore, the PWBs are frequently subjected Lo high temperatures from such needs as temporary mounting of the SMDs, mounting of the SMDs on both surfaces, and mounting of the SMDs and discrete parts in a mixed manner.

Due to the poor heat-resistance of the imidazole compounds having a long-chain alkyl group at the 2-position, PWBs treated with these imidazole compounds show poor soldability after being subjected to high temperatures.

As for the surface treating method using the 5-methylbenzimidazole disclosed in Japanese Laid-Open Patent Publication No. 501281/1983, this compound dissolves in the water so easily that it is not allowed to form a desired coating having a thickness of 0.08 μm or greater on the surfaces of the copper. Therefore, the underlying copper is not sufficiently protected from oxidation under high temperature conditions, and copper oxide that is formed hinders the soldering.

As for the methods of preserving solderability by using the 2-alkylbenzimidazole compound. 2-arytbenzimidazole compound. 2-aralkylbenzimidazole compound and 2-mercaptoalkylbenzimidazole compound, a chemical layer having good heat resistance can be formed on the surface of the copper; however, the following problems must be solved for practical use.

That is, the benzimidazole-type compounds dissolve little in the water and easily undergo crystallization as the pH of the prepared treating solution increases or as the treating solution vaporizes. The solid benzimidazole-type compounds that have once crystallized are dissolved again with difficulty despite the efforts of lowering the pH of the treating solution by adding acids or by replenishing the water that has vaporized.

When the benzimidazole-type compounds crystallize or precipitate in the manufacturing process of treating the surfaces of copper of PWB. PWB fabricator is obliged to wipe off the benzimidazole-type compounds that have adhered on the machine or to clean up the machine. Moreover, the solid benzimidazole-type compounds adhered on the surfaces of the PWB seriously deprive them of commercial values. Removal of the adhered benzimidazole-type compounds requires additional repair-work which is much of a problem. The heat-resistance of the chemical layer of these benzimidazole-type compounds are good compared with those of alkyimidazole compounds; however, much more technical improvements on heat-resistance, soldability (solder flow-up and spreadability of solder paste), and ease of handling are still required.

According to the methods of preserving solderability by using the 2-mercaptobenzimidazole described in Japanese Laid-Open Patent Publications Nos. 83157/1980 and 77600/1987. the 2-mercaptobenzimidazole is dissolved in an organic solvent such as methanol, applied onto the PWBs and is dried leaving; however, there are problems such as adversely affecting the human body due to the use of an organic solvent and from the standpoint of maintaining safety in the factory. As for the method described in Japanese Laid-Open Patent Publication No. 118598/1988, the dip processing of about three hours is necessary for forming a thin chemical layer of 2-mercaptobenzimidazole, making itself not suited for practical use under the circumstances of PCB business where high productivity and high-speed processing are required.

Japanese Laid-Open Patent Publication No. 206681/1992 discloses a method of forming a chemical layer on the surfaces of copper by dipping PCBs in an aqueous solution which contains an imidazole compound substituted with an aryl group at the 2-position and higher fatty acids or higher fatty acid compounds such as a ammonium salts or amine salts of higher fatty acids. As the imidazole compounds substituted with an aryl group at 2-position, there have been exemplified a 2-phenylimidazole, a 2-tolylimidazole, a 2-phenyl-4-methylimidazole, a 2-phenyl-4-benzylimidazole, a 2,4,5-triphenylimidazole.

The invention disclosed in Japanese Laid-Open Patent Publication No. 206681/1992 contains, as essential components, an imidazole compound substituted with an aryl group at the 2-position and higher fatty acids or higher fatty acid compounds such as ammonium salts or amine salts of higher fatty acids. According to the invention disclosed therein, a chemical coating having excellent heat resistance is obtained by making a higher fatty acid present in the imidazole compound substituted with an aryl group at the second position that is little apable of forming a coating.

However, in order to form the chemical layer and to exhibit its performances and water repellency, the above invention must use a higher fatty acid compound with 12 to 22 carbon atoms as an essential component. Without using the higher fatty acid, it is not allowed for the above invention to form a chemical layer. To dissolve the higher fatty acid compound in the water, the solution must usually be alkaline. In order to dissolve the imidazole compound substituted with an aryl group at the Z-position in the water, however, the solution must be rendered acidic, that is, to put the above invention into practical use, there arises a difficulty in preparing an aqueous solution in which are present both the imidazole compound having an aryl group at the 2-position and the higher fatty acid compound. To render the two components dissolved, a mixture solution must be prepared by adding water-soluble organic solvents such as methanol and acetone in addition to the water.

However, use of such organic solvents arises problems such as adversely affecting the human body and from the standpoint of maintaining safety in the factory. Besides, the vaporization of the organic solvent during the use causes the composition of the treating solution to change and brings about problems in that the imidazole compound having an aryl group at the 2-position and higher fatty acid compounds which are active ingredients are liable to be precipitated.

To protect the copper circuit on the PWBs by using a chemical layer under the above-mentioned circumstances, therefore, it has been desired to provide a preflux having excellent properties such as excellent heat resistance and soldability to meet the surface-mounting technology of PCB industry, without permitting solid matters to precipitate in the treating solution during the use or enabling the solid matters to be easily dissolved again if they were precipitated.

SUMMARY OF THE INVENTION

In order to solve the above-mentioned problems, the present inventors have conducted the study and have discovered the fact that a water-based surface treating agent which contains, as essential components, 0.01 to 5% by weight of a 2-arylimidazole compound represented by the following formula and to 20% by weight of an aliphatic carboxylic acid having not more than 4 carbon atoms, makes it possible to singularly form a chemical layer on the surface of the copper without the need of using a higher fatty acid. The inventors have further discovered the fact that the surface treating agent has excellent stability (during its use), such as permitting solid matters to precipitate little or enabling the solid matters to easily dissolve again in ease they are precipitated, and that the obtained chemical layer exhibits excellent heat-resistance and humidity-resistance maintaining excellent soldability, and have thus arrived at the present invention.

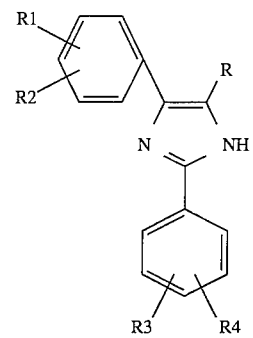

wherein R is a hydrogen atom or a methyl group, R1 and R2 are hydrogen atoms, lower alkyl groups or halogen atoms, and R3 and R1 are hydrogen atoms, lower alkyl groups, halogen atoms, lower alkoxy groups, di-lower alkylamino groups, cyano groups or nitro groups.

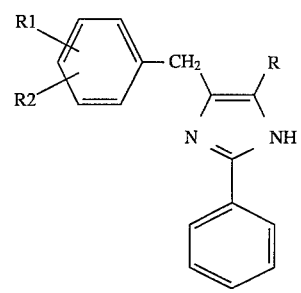

wherein R is a hydrogen atom or a methyl group, and R1 and R2 are hydrogen atoms, lower alkyl groups or halogen atoms, but excluding the case where R, R1 and R2 are all hydrogen atoms.

The 2-arylimidazole compounds of general formulae (1) and (2) which are used as the surface treating agents of the present invention are characterized in that the 4-position of the imidazole ring has an aryl group or an arylmethyl group and the 5-position has a hydrogen atom or a methyl group. The compounds of general formulae (1) and (2) have a excellent solder wetting time, solder flow-up rate, and spreadability of solder paste and are excellent in all respects as compared with the compounds specifically shown in the Examples in the above Japanese Laid-Open Patent Publication No. 206681/92, namely 2-phenylimidazole (hydrogen atoms at the 4- and 5-positions, see Comparative Example 2 to be described later) or 2-phenyl- 4-methylimidazole (methyl at the 4-position and hydrogen at the 5-position, see Comparative Example 4) when these compounds are used in the surface treatment of copper or copper alloys.

On the other hand, 2-arylimidazole compounds obtained by introducing aryl groups into both of the 4- and 5-positions of the imidazole ring (see Comparative Example 10), namely 2, 4, 5 -triphenylimidazole (see Comparative Example) exemplified as a typical compound in the above Laid-Open Patent Publication lack the ability to chemical layer without a higher fatty acid.

From the foregoing fact, it will be understood that the possession of an aryl group or an arylmethyl group at the 4-position of the imidazole ring and the possession of a hydrogen atom or a methyl group at the 5-position are important in respect of forming the ability to form a chemical layer without the presence of higher fatty acid and also in respect of the solder wetting time, the solder flow-up rate, and the spreadability of solder paste.

By using a lower fatty acid having 4 or less carbon atoms, the 2-arylimidazole compounds of general formulae (1) and (2) dissolve easily in water, and are better than known 2-arylimidazole-type surface treating agents in respect of not only the workability of producing an aqueous solution but also the workability of surface treatment.

From the above-mentioned view point, 2-phenyl-4-benzylimidazole which is illustrated as a typical compound in the above Laid-Open Patent Publication must show the same effect. In our experiment, it has been found that without a higher fatty acid, an effective chemically coated film could not be formed (see Comparative Example 9).

In the 2-phenyl-4-arylmethylimidazole compounds of general formula (2), when R is hydrogen, at least one of R1 and R2 is specified as a lower alkyl group or a halogen atom. This is because we intend to mean the exclusion of 2-phenyl-4-benzylimidazole.

DETAILED DESCRIPTION OF THE INVENTION

Representative examples of the compound suited for putting the present invention into practical use include 2, 4-diphenyl imidazole, 2, 4-diphenyl-5-methylimidazole and 2-phenyl-4-benzyl-5-methylimidazole, as well as 2-phenyl-4-(4-chlorophenyl)imidazole, 2-phenyl-4-(2, 4-dichlorophenyl)imidazole, 2-phenyl-4-(4-bromophenyl)imidazole, 2-phenyl-4-(2-tolyl) imidazole, 2-phenyl-4-xylylimidazole, 2-(4-chlorophenyl)-4-phenyl imidazole, 2-(4-bromophenyl)-4-phenylimidazole, 2-(2,4-dichlorophenyl)-4-phenyl imidazole, 2-(4-tolyl)-4-phenyl imidazole, 2-(4-methoxyphenyl)-4-phenylimidazole, 2-(4-dimethylaminophenyl)-4-phenylimidazole, 2-(4-cyanophenyl)-4-phenylimidazole, 2-(3-nitrophenyl)-4-phenylimidazole, 2-(2,4-xylyl)-4-phenylimidazole, 2-(4-chlorophenyl)-4-(4-chlorophenyl)imidazole, 2-(2,4-dichlorophenyl)-4-(2-tolyl)imidazole, 2-(2-bromophenyl)-4-(2, 3-xylyl)imidazole, 2-(4-ethylphenyl)-4-(2-chlorophenyl)imidazole, 2-(2-ethoxyphenyl)-4-(4-bromophenyl)imidazole, 2-(2-cyanophenyl)-4-(4-tolyl)imidazole, 2-(3-nitrophenyl)-4-(2, 3-dichlorophenyl)imidazole, 2-(4-diethylaminophenyl)-4-(4-fluorophenyl)imidazole, 2- (4-chlorophenyl)-4-phenyl-5-methylimidazole, 2-(4-tolyl)-4-phenyl-5-methylimidazole, 2-(2, 4-dichorophenyl)-4-phenyl-5-methylimidazole, 2-(2, 3-xylyl)-4-phenyl-5-methylimidazole, 2-(4-methoxyphenyl)-4-phenyl-5-methylimidazole, 2-(4-dimethylaminophenyl)-4-phenyl-5-methylimidazole, 2-(2-nitrophenyl)-4-phenyl-5-methylimidazole, 2-(3-cyanophenyl)-4-(4-chlorophenyl)-5-methylimidazole, 2-phenyl-4-(4-chlorophenylmethyl)-5-methylimidazole, 2-phenyl-4-(2-chlorophenylmethyl)-5-methylimidazole, 2-phenyl-4-(4-bromophenylmethyl)-5-methylimidazole, 2-phenyl-4-(2, 4-dichlorophenylmethyl)-5-methylimidazole, 2-phenyl-4-(3, 4-dichlorophenylmethyl)-5-methylimidazole, 2-phenyl-4-(tolylmethyl)-5-methylimidazole, 2-phenyl-4-(4-chlorophenylmethyl)imidazole, 2-phenyl-4-(2-chlorophenylmethyl)imidazole, 2-phenyl-4-(4-bromophenylmethyl)imidazole, 2-phenyl-4-(2, 4-dichlorophenylmethyl)imidazole, 2-phenyl-4-(3, 4-dichlorophenylmethyl)imidazole and the like.

The 2, 4-diphenylimidazole compound used in the present invention is synthesized by heating a benzamidine compound and a phenacyl halide compound in a solvent such as chloroform as represented by the following formula.

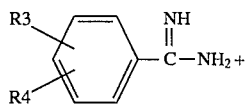
(3)

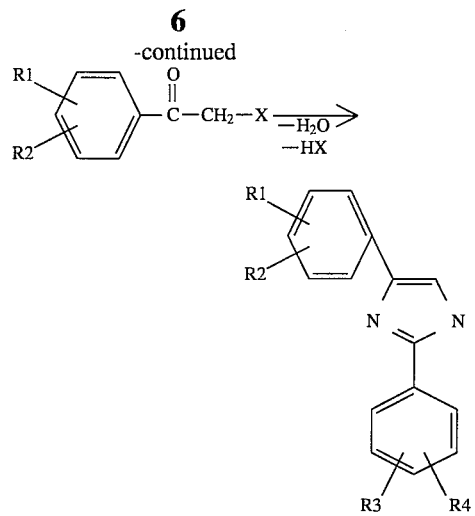

wherein R1, R2, R3 and R4 are as defined above, and

X is a chlorine atom or a bromine atom.

The 2, 4-diphenyl-5-methylimidazole compound used in the present invention is obtained by heating a benzaldehyde compound, a 1-aryl-1, 2-propanedione compound and an ammonium acetate in the acetic acid as represented by the following formula,

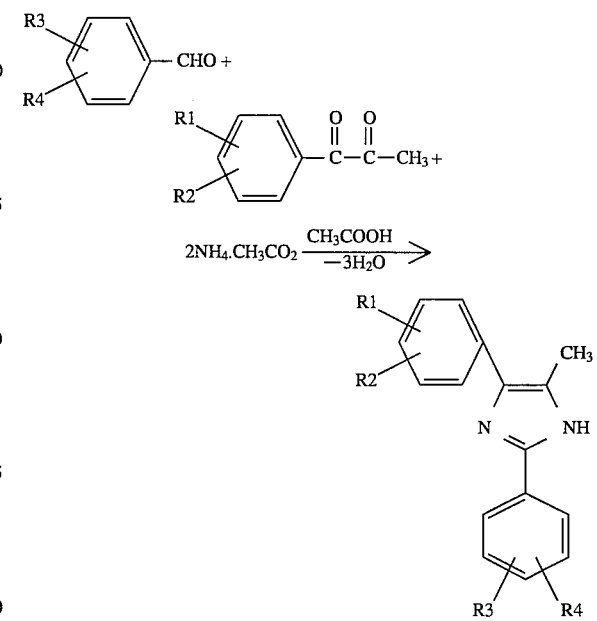

wherein R1, R2, R3 and R4 are as defined above.

The 2-phenyl-4-(arylmethyl)imidazole compound is obtained by heating a 2-phenylimidazole compound and a benzyl chloride compound as represented by the following formula,

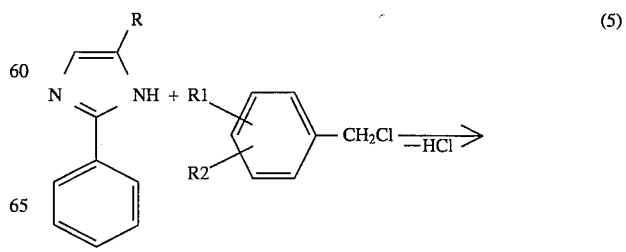
(5)

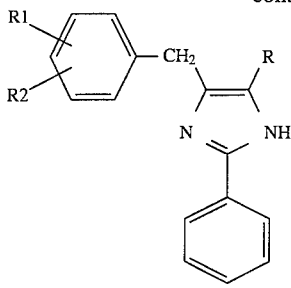

wherein R, R1 and R2 are as defined above.

In an embodiment of the present invention, the 2-arylimidazole compound is used as an active ingredient in an amount of from 0.01 to 5% by weight and, preferably, from 0.1 to 1.0% by weight.

When the concentration of the 2-arylimidazole compound is smaller than 0.01% by weight, the rate of forming a chemical layer becomes very small and when its concentration becomes higher than 5% by weight, it becomes difficult to obtain it in the form of an aqueous solution and an acid must be added in large amounts, which is not desirable.

The present inventors have found that the 2-arylimidazole compound can be dissolved in an aqueous solution which contains 1 to 20% by weight of an aliphatic carboxylic acid having not more than 4 carbon atoms. In this case, when the concentration of the lower aliphatic carboxylic acid is smaller than 1% by weight, the 2-arylimidazole compound cannot be completely dissolved in the aqueous solution. When the concentration of the lower aliphatic carboxylic acid exceeds 20% by weight, on the other hand, the working environment is impaired and the apparatus tends to be corroded.

Examples of the lower aliphatic carboxylic acid suited for the embodiment of the present invention include formic acid, acetic acid, propionic acid, butylic acid and isobutylic acid. Among them, formic acid and acetic acid are particularly preferred.

To the surface treating agent of the present invention may be added lower alcohols such as methanol, ethanol and isopropyl alcohol, or an organic solvent miscible with water such as acetone or an N,N-dimethylformamide, or a higher fatty acid such as oleic acid or lauric acid.

To the surface treating agent of the present invention may be added a copper compound to quicken the rate of forming a chemical layer on the copper and a zinc compound for further improving the heat resistance of the formed chemical layer.

Representative examples of the copper compound that can be used in the present invention include cuprous chloride, cupric chloride, copper hydroxide, copper phosphate, copper acetate, copper sulfate, copper nitrate and copper bromide, and representative examples of the zinc compound include zinc oxide, zinc formate, zinc acetate, zinc oxalate, zinc lactate, zinc citrate, zinc sulfate, zinc nitrate and zinc phosphate, which may be added to the aqueous solution in an amount of from 0.01 to 10% by weight and, preferably, in an amount of from 0.02 to 5% by weight.

When the copper compound or the zinc compound is used as described above, it is desired to add a substance having a buffering action such as ammonia of amines to stabilize the pH of the solution.

The surfaces of copper or a copper alloy are treated by using the surface treating agent of the present invention under the conditions of a solution temperature of the treating agent of about 20° C. to about 60° C. for a contacting time of from one second to 10 minutes. The contacting method is based upon immersion, spraying or coating.

In using the surface treating agent of the present invention, the heat resistance can be further improved by forming a double structure of a thermoplastic resin on the chemical coating that is formed on the surface of copper metal.

That is, a chemical layer of the 2-arylimidazole compound is formed on the surface of copper or a copper alloy. Then, a thermoplastic resin having excellent heat resistance like a rosin, a rosin derivative such as a rosin ester, a terpene resin, a terpene resin derivative such as a terpene phenol resin, or a hydrocarbon resin such as an aromatic hydrocarbon resin, an aliphatic hydrocarbon resin or an alicyclic hydrocarbon resin, or a mixture thereof, is dissolved in a solvent such as toluene, ethyl acetate or isopropyl alcohol, and is uniformly applied onto the chemical layer by the roll coater method or the like method, such that the thickness thereof is 1 to 30 μm, thereby to form a two-layer structure consisting of the chemical layer and the thermoplastic resin.

When the surface of copper or the copper alloy is brought into contact with the treating solution containing the 2-arylimidazole compound of the present invention, the chemical layer of the 2-arylimidazole compound that has locally turned into a copper complex is quickly formed on the surface of copper or the copper alloy due to a complex-forming reaction between the 2-arylimidazole compound and copper and further due to the action of hydrogen bonds in the 2-arylimidazole compound.

When the chemical layer is left to stand or is heated, copper starts migrating from the surface of copper and, at the same time, the lower aliphatic carboxylic acid volatilizes, and most of the 2-arylimidazole compound turns into a complex of the 2-arylimidazole compound with copper. The chemical layer comprising the copper complex remains thermally and chemically stable, and protects the underlying copper or the copper alloy from the oxidation when it subjected to high temperatures and when it is left to stand for extended periods of time.

A copper plate or a copper alloy plate treated by using a surface treating agent that contains the compound of the present invention exhibits markedly excellent solder flow-up rate and spreadability of solder paste compared with those that are treated by using a surface treating agent that contains a 2-alkylimidazole compound, an imidazole compound having an aryl group at the 2-position only and benzinimidazole compounds.

Among the 2-arylimidazole compounds of the present invention, the 2, 4-diphenylimidazole, 2, 4-diphenyl-5-methylimidazole and 2-phenyl-4-benzyl-5-methylimidazole exhibit very excellent solder wetting time before and after the humidity test, excellent solder flow-up rate, and excellent spreadability of solder paste.

Furthermore, the surface treating agent in the form of an aqueous solution containing 0.01 to 5% by weight of the 2-arylimidazole compound and 1 to 20% by weight of the aliphatic carboxylic acid having not more than 4 carbon atoms of the present invention permits the 2-arylimidazole compound to be dissolved therein to a high degree and can, hence, be stably preserved for extended periods of time. Even when the composition of the treating solution is changed during use, the 2-arylimidazole compounds of the present invention are very little likely to be precipitated. Even in case they are precipitated, the crystals dissolve again when the composition of the treating solution is returned to normal. Therefore, the operation can be carried out stably and continuously.

The invention will now be concretely described by way of Examples and Comparative Examples.

In these testings, the thickness of the chemical layer was measured as follows. A test piece having a predetermined copper area was immersed in a 0.5% of aqueous solution of hydrochloric acid to elute the chemical layer of 2-arylimidazole and the concentration of the 2-arylimidazole in the solution was measured by using an ultraviolet spectrophotometer. The thickness of the chemical layer was calculated from the measured concentration.

Among the soldability tests, the solder wetting time was measured as follows. A copper plate measuring 5 mm×50 mm×0.3 mm was used as a test piece which was then degreased, soft-etched, and was rinsed with the water. The test piece was then immersed in the surface treating agent of a composition of the Examples and Comparative Examples maintained at a predetermined rinsed temperature for a predetermined period of time, and was then rinsed with the water and dried to form a chemical layer maintaining a thickness of about 0.10 to 0.25 μm on the surfaces of the test piece.

The test piece on which the chemical layer was formed was left to stand under the conditions shown in Table 1 and was heat-treated in a hot-air oven heated at 200° C. for 10 minutes. Then, the test piece was immersed in a postflux (trade name: J8-64, produced by Koki Co.). and the solder wetting time was measured. The measurement was taken by using a solder wetting tester (model WET-3000, produced by Reska Co.) under the conditions of a solder temperature of 250° C., immersion depth of 2 mm and an immersion rate of 16 mm/sec.

Among the soldability tests, the solder flow-up rate was measured as follows. A PWB measuring 5 cm×10 cm×1.2 mm and having 629 copper through holes with an inner diameter of 0.08 mm was used as a test piece, which was then degreased, soft-etched and was rinsed with the water. Like the case of measuring the solder wetting time, the test piece was immersed in the surface treating agent for a predetermined period of time, rinsed with the water and was dried to form a chemical layer maintaining a thickness of about 0.10 to 0.25 μm on the surfaces of the test piece.

The test piece on which the chemical layer has been formed was left to stand under the conditions shown in Table 1 and was subjected three times of reflow-heating in which a peak temperature was 230° C. by using an infrared-ray reflow device (model MULTI-PRO-306, produced by Vitronits Co.). Then, to measure the solder flow-up rate after fellow-heating, a flow soldering was conducted on the test piece using the postflux (trade name; AGF-ZOO-J9, produced by Asahi Kaken Co.,) under the conditions of the solder temperature of 250° C. the belt speed of 1.0 m/min.

The measured result was indicated by a rate (%) of the number of copper through holes in which the solder was filled up perfectly with respect to the total number of the copper through holes.

The spreadability of the solder paste was tested as follows. A testing PCB called 1-type defined by JIS Z-3197,6.8 was used as a test piece. A test piece was then degreased, soft-etched and rinsed with water. The test piece was then immersed in the surface treating agent in the same manner as that of measuring the solder wetting property, and was rinsed with the water followed by drying to form a chemical layer of a thickness of about 0.10 to 0.25 μm on the surfaces of the test piece. The test piece was then left to stand at room temperature for 10 days.

Onto the test piece on which the chemical layer has been formed and which was left to stand for 10 days, a solder paste (trade name; AE-S3HGI, produced by Shikoku Chemicals Co.,) was then printed with the width of 3 min. The test piece was then fellow-heated (peak temperature of 230° C.) using an infrared-ray fellow device (model MULTI-PRO-306, produced by Vitrohies Go.). Finally, the width of the spread solder paste was measured.

EXAMPLE (Example 1)

A test piece for measuring the solder wetting time, solder flow-up rate and spreadability of solder paste was immersed in a an aqueous treating solution which comprises 0.25% by weight of a 2, 4-diphenylimidazole. 9.0% by weight of acetic acid. 0.09% by weight of cupric acetate and 0.04% by weight of ammonium bromide of which the pH was adjusted to 4.0 with ammonia water, at a solution temperature of 50° C. for 60 seconds, followed by the rinsing with the water and drying.

The solder wetting time was measured, after the test piece was left to stand under the conditions shown in Table 1 and after the heating was conducted on the test piece. The solder flow-up rate and the spreadability of the solder paste were measured after the test pieces were left to stand at room temperature for 10 days. The results were as shown in Table 1.

(Example 2)

A test piece was immersed in an aqueous treating solution which comprises 0.25% by weight of the 2, 4-diphenylimidazole, 10.0% by weight of acetic acid, 0.03% by weight of n-heptanoic acid, and 0.05% by weight of cupric bromide and of which the pH was adjusted to 3.8 with ammonia water, at a solution temperature of 5° C. for 60 seconds. The test piece was then taken out, rinsed with the water and was dried. The solder wetting time, the solder flow-up rate, and the spreadability of solder paste were tested in the same manner as in Example 1. The results were as shown in Table 1.

(Example 3)

A test piece was immersed in an aqueous treating solution which comprises 0.20% by weight of a 2, 4-diphenyl-5-methylimidazole, 5.0% by weight of formic acid, and 0.05% by weight of cupric bromide and of which the pH was adjusted to 3.4 with ammonia water, at a solution temperature of 50° C. for 70 seconds. The test piece was then taken out, rinsed with the water and was dried. The solder wetting time, the solder flow-up rate, and the spreadability of solder paste were tested in the same manner as in Example 1. The results were as shown in Table 1.

(Example 4)

A test piece was immersed in an aqueous treating solution which comprises 0.20% by weight of the 2, 4-diphenyl-5-methylimidazole, 10.0% by weight of acetic acid, 0.03% by weight of n-heptanoic acid, and 0.10% by weight of cupric bromide and of which the pH was adjusted to 4.2 with ammonia water, at a solution temperature of 45° C. for 60 seconds. The test piece was then taken out, rinsed with the water and was dried. The solder wetting time, the solder flow-up rate, and the spreadability of solder paste were tested in the same manner as Example 1. The results were as shown in Table 1.

(Example 5)

A test piece was immersed in an aqueous treating solution which comprises 0.40% by weight of a 2-phenyl-4-benzyl-5-methylimidazole, 2.0% by weight of acetic acid, 0.063% by weight of cupric acetate and 0.025% by weight of ammonium bromide at a solution temperature of 50° C. for 60 seconds followed by rinsing with the water and drying. The solder wetting time, the solder flow-up rate, and the spreadability of solder paste were tested in the same manner as in Example 1. The results were as shown in Table 1.
(Example 6)
A test piece was immersed in an aqueous treating solution which comprises 0.20% by weight of a 2-phenyl-4-(4-chlorophenylmethyl)imidazole, 2.0% by weight of acetic acid, and 0.05% by weight of cupric bromide at a solution temperature of 50° C. for 40 seconds. The test piece was then taken out, rinsed with the water and was dried. The solder wetting time, the solder flow-up rate, and the spreadability of solder paste were tested in the same manner as in Example 1. The results were as shown in Table 1.
(Example 7)
A test piece was immersed in an aqueous treating solution which comprises 0.20% by weight of a 2-phenyl-4-(3, 4-dichlorophenylmethyl)imidazole. 6.0% by weight of acetic acid, and 0.05% by weight of cupric bromide at a solution temperature of 50° C. for 67 seconds. The test piece was then taken out, rinsed with the water and was dried. The solder wetting time, the solder flow-up rate, and the spreadability of solder paste were tested in the same manner as in Example 1. The results were as shown in Table 1.
(Example 8)
A test piece was immersed in an aqueous treating solution which comprises 0.20% by weight of a 2-phenyl-4-(4-methylphenylmethyl)imidazole, 3.0% by weight of acetic acid, 0.0631 by weight of cupric acetate and 0.025% by weight of ammonium bromide at a solution temperature of 50° C. for 50 seconds. The test piece was then taken out, rinsed with the water and was dried. The solder wetting time, the solder flow-up rate, and the spreadability of solder paste were tested in the same manner as in Example 1. The results were as shown in Table 1.
(Example 9)
A test piece was immersed in an aqueous treating solution which comprises 0.20% by weight of a 2-phenyl-4-(4-chlorophenylmethyl)-5-methylimidazole, 10.0% by weight of formic acid, and 0.063% by weight of cupric chloride at a solution temperature of 50° C. for 85 seconds. The test piece was then taken out, rinsed with the water and was dried. The solder wetting time, the solder flow-up rate, and the spreadability of solder paste were tested in the same manner as in Example 1. The results were as shown in Table 1.
(Example 10)
A test piece was immersed in an aqueous treating solution which comprises 0.20% by weight of a 2-(2, 4-dichlorophenyl)-4-phenyl-5-methylimidazole, 10.0% by weight of acetic acid. 0.051 by weight of n-heptanoic acid, and 0.05% by weight of cupric bromide and of which the pH was adjusted to 3.6 with ammonia water, at a solution temperature of 45° C. for 60 seconds. The test piece was then taken out, rinsed with the water and was dried. The solder wetting time, the solder flow-up rate, and the spreadability of solder paste were tested in the same manner as in Example 1. The results were as shown in Table 1.
(Example 11)
A test piece was immersed in an aqueous treating solution which comprises 0.30% by weight of a 2-phenyl-4-(2-tolyl)imidazole, 5.0% by weight of acetic acid, 0.03% by weight of n-heptanoic acid, and 0.08% by weight of cupric chloride and of which the pH was adjusted to 3.7 with ammonia water, at a solution temperature of 45° C. for 30 seconds. The test piece was then taken out, rinsed with the water and was dried. The solder wetting time, the solder flow-up rate, and the spreadability of solder paste were tested in the same manner as in Example 1. The results were as shown in Table 1.

(Example 12)
A test piece was immersed in an aqueous treating solution which comprises 0.25% by weight of a 2-(4-tolyl)-4-phenylimidazole, 10.0% by weight of acetic acid and 0.05% by weight of cupric bromide and of which the pH was adjusted to 3.9 with ammonia water, at a solution temperature of 45° C. for 45 seconds. The test piece was then taken out, rinsed with the water and was dried. The solder wetting time, the solder flow-up rate, and the spreadability of solder paste were tested in the same manner as in Example 1. The results were as shown in Table 1.
(Comparative Example 1)
A test piece was immersed in an aqueous treating solution which comprises 1.0% by weight of a 2-undecylimidazole and 1.6% by weight of acetic acid and of which the pH was adjusted to 4.4 with ammonia water, at a solution temperature of 50° C. for 25 seconds. The test piece was then taken out, rinsed with the water and dried. The solder wetting time, the solder flow-up rate, and the spreadability of solder paste were tested in the same manner as in Example 1. The results were as shown in Table 1.
(Comparative Example 2)
A test piece was immersed in an aqueous treating solution which comprises 1.0% by weight of a 2-phenylimidazole, 2.0% by weight of acetic acid, 0.1% by weight of lauric acid and 0.05% by weight of cupric bromide and of which the pH was adjusted to 6.2 with ammonia water, at a solution temperature 50° C. for 30 seconds. The test piece was then taken out, rinsed with the water and dried. The solder wetting time, the solder flow-up rate, and the spreadability of solder paste were tested in the same manner as in Example 1. The results were as shown in Table 1.
(Comparative Example 3)
An aqueous treating solution was prepared having the same composition as that of Comparative Example 2 but without containing lauric acid, and a test piece was immersed therein at a solution temperature of 50° C. for 120 seconds. However, no chemical layer was formed on the test piece.
(Comparative Example 4)
A test piece was immersed in an aqueous treating solution which comprises 1.0% by weight of a 2-phenyl-4-methylimidazole, 2.0% by weight of acetic acid. 0.05% by weight of myristic acid and 0.05% by weight of cupric bromide and or which the pH was adjusted to 6.0 with ammonia water, at a solution temperature of 50° C. for 40 seconds. The test piece was then taken out, rinsed with the water and dried. The solder wetting time, the solder flow-up rate, and the spreadability of solder paste were tested in the same manner as in Example 1. The results were as shown in Table 1.
(Comparative Example 5)
An aqueous treating solution was prepared having the same composition as that of Comparative Example 4 but without containing myristic acid, and a test piece was immersed therein at a solution temperature of 50° C. for 120 seconds. However, no chemical layer was formed on the test piece.
(Comparative Example 6)
A test piece was immersed in an aqueous treating solution which comprises 0.2% by weight of a 2-nonylbenzimidazole, 5.0% by weight of acetic acid and 0.035% by weight of cupric chloride and of which the pH was adjusted to 2.9 with ammonia water, at a solution temperature of 40° C. for 30 seconds. The test piece was then taken out, rinsed with the water and dried. The solder wetting time, the solder flow-up rate, and the spreadability of solder paste were tested the same manner as in Example 1. The results were as shown in Table 1.

(Comparative Example 7)

A test piece was immersed in an aqueous treating solution which comprises 0.5% by weight of a 2-(4-chlorophenylmethyl)benzimidazole, 3.0% by weight of formic acid, 0.04% by weight of heptanoic acid and 0.09% by weight of cupric chloride and of which the pH was adjusted to 2.56 with ammonia water, at a solution temperature of 50° C. for 60 seconds. The test piece was then taken out, rinsed with the water and dried. The solder wetting time, the solder flow-up rate, and the spreadability of solder paste were tested in the same manner as in Example 1. The results were as shown in Table 1.

(Comparative Example 8)

A test piece was immersed in an aqueous treating solution which comprises 0.25% by weight of a 2-tolylimidazole, 3.0% by weight of acetic acid and 0.05% by weight of cupric bromide and of which the pH was adjusted to 5.0 with ammonia water, at a solution temperature of 50° C. for 60 seconds. However, no chemical layer was formed.

(Comparative Example 9)

A test piece was immersed in an aqueous treating solution which comprises 0.25% by weight of a 2-phenyl-4-benzylimidazole, 2.0% by weight of formic acid, 0.09% by weight of copper acetate and 0.04% by weight of ammonium bromide and of which the pH was adjusted to 3.8 with ammonia water, at a solution temperature of 50° C. for 60 seconds. However, no chemical layer was formed.

(Comparative Example 10)

A test piece was immersed in an aqueous treating solution which comprises 0.2% by weight of a 2, 4, 5-triphenylimidazole, by weight of formic acid, and 0.06% by weight of copper bromide and of which the pH was adjusted to 2.80 with ammonia water, at a solution temperature of 50° C. for 60 seconds. However, no chemical layer was formed.

TABLE 1

| | Solder wetting properties | | | |
|---|---|---|---|---|
| | Conditions in which test pieces are left to stand after coating is formed | Solder wetting time | Solder flow-up rate property | solder paste spreading property |
| Example 1 | Left to stand at room temp. for 10 days | 0.34 sec | 100% | 17.3 mm |
| | Left to stand at 60° C. 95% RH for 4 days | 0.52 sec | | |
| Example 2 | same as above | 0.31 sec 0.49 sec | 100% | 17.0 mm |
| Example 3 | same as above | 0.42 sec 0.63 see | 100% | 15.5 mm |
| Example 4 | same as above | 0.45 sec 0.70 sec | 100% | 16.4 mm |
| Example 5 | same as above | 0.49 sec 0.70 sec | 100% | 17.3 mm |
| Example 6 | same as above | 0.64 sec 0.89 sec | 100% | 9.5 mm |
| Example 7 | same as above | 0.74 sec 0.96 sec | 100% | 8.9 mm |
| Example 8 | same as above | 0.78 sec 1.02 sec | 100% | 7.8 mm |
| Example 9 | same as above | 0.85 see 0.97 sec | 100% | 8.6 mm |
| Example 10 | same as above | 0.41 sec 0.88 sec | 100% | 11.5 mm |
| Example 11 | same as above | 0.48 sec 0.50 sec | 100% | 10.9 mm |
| Example 12 | same as above | 0.58 sec 0.71 sec | 100% | 12.1 mm |

TABLE 1-continued

| | Solder wetting properties | | | |
|---|---|---|---|---|
| | Conditions in which test pieces are left to stand after coating is formed | Solder wetting time | Solder flow-up rate property | solder paste spreading property |
| Comparative Example 1 | same as above | 10 sec or longer 10 sec or longer | 10% | 3.5 mm or smaller |
| Comparative Example 2 | same as above | 2.80 sec 5.95 sec | 52% | 4.5 mm |
| Comparative Example 4 | same as above | 2.43 sec 5.40 sec | 62% | 4.2 mm |
| Comparative Example 6 | same as above | 1.95 sec 4.54 sec | 82% | 3.9 mm |
| Comparative Example 7 | same as above | 0.95 sec 2.56 sec | 92% | 5.7 mm |

(Example 13)

The following testing was conducted in order to examine the stability of the aqueous treating solutions.

The treating solutions used in the above Examples and Comparative Examples (excluding Comparative Examples 3, 5, 8, 9 and 10) were heated to vaporize about 30% of the water, so that the active ingredient such as imidazole compounds and benzimidazole compounds were precipitated. When the active ingredients were not precipitated, the ammonia water was added in a required amount to precipitate the active ingredients. Then, the water and acid were added to the treating solutions from which the crystals were precipitated to return the compositions back to the original treating solution compositions, which were then heated at 40° C. to examine whether the active ingredients were dissolved again or not.

The results of testing were as shown in Table 2.

TABLE 2

| Sample No. | Results of testing |
|---|---|
| Example 1 | Honogenous and transparent treating solution was obtained |
| Example 2 | same as above |
| Example 3 | same as above |
| Example 4 | same as above |
| Example 5 | same as above |
| Example 6 | same as above |
| Example 7 | same as above |
| Example 8 | same as above |
| Example 9 | same as above |
| Example 10 | same as above |
| Example 11 | same as above |
| Example 12 | same as above |
| Compa. Example 1 | same as above |
| Compa. Example 2 | same as above |
| Compa. Example 4 | same as above |
| Compa. Example 6 | Crystals did not re-dissolve |
| Compa. Example 7 | same as above |

The treating solution containing the 2-arylimidazole compound of the present invention forms a chemical layer having excellent heat resistance on the surface of copper metal, and assures good soldability even after the reflow heating. Even in the manufacturing process of treating the PCBs, the aqueous treating solution which contains both the 2-arylimidazole compound and a lower aliphatic carboxylic acid does not cause such troubles as precipitation of active ingredients in the treating bath, and presents great practical advantage such as enabling the operation to be stably carried out.

What is claimed is:

1. A method for forming a chemical layer on the surface of copper or a copper alloy which comprises contacting the surface of the copper or copper alloy with an aqueous solution consisting essentially of 0.01 to 5% by weight of a 2-arylimidazole compound selected from the group consisting of 2,4-diphenylimidazole, 2,4-diphenyl-5-methylimidazole and 2-phenyl- 4-benzyl-5-methylimidazole, 1 to 20% by weight of an aliphatic carboxylic acid having not more than 4 carbon atoms, 0.01 up to 10% by weight of a copper compound effective for increasing the rate of forming said chemical layer on the copper or copper alloy, up to 10% by weight of a zinc compound effective for improving the heat resistance of said chemical layer, a pH stabilizing effective amount of ammonia or an amine compound, and an aqueous solvent consisting essentially of water.

2. The method of claim 1 wherein the 2-arylimidazole compound is 2,4-diphenylimidazole.

3. The method of claim 1 wherein the 2-arylimidazole compound is 2,4-diphenyl-5-methylimidazole.

4. The method of claim 1 wherein the 2-arylimidazole compound is 2-phenyl-4-benzyl-5-methylimidazole.

5. The method of claim 1 wherein the aqueous solution contains from 0.02 to 5% by weight of the copper compound.

6. The method of claim 1 wherein the copper compound is selected from the group consisting of cuprous chloride, cupric chloride, copper hydroxide, copper phosphate, copper acetate, copper sulfate, copper nitrate and copper bromide.

7. The method of claim 1 wherein the aliphatic carboxylic acid is formic acid or acetic acid.

8. The method of claim 1 which comprises contacting the surface of the copper or copper alloy with the aqueous solution at a temperature of from about 20° C. to about 60° C. for from one second to 10 minutes.

\* \* \* \* \*